United States Patent
Oh et al.

(10) Patent No.: US 10,295,604 B2
(45) Date of Patent: May 21, 2019

(54) BATTERY STATE-OF-CHARGE ESTIMATION METHOD AND BATTERY MANAGEMENT SYSTEM

(71) Applicant: SILICON WORKS CO., LTD., Daejeon-si (KR)

(72) Inventors: Hyung Seog Oh, Daejeon-si (KR); Ju Pyo Hong, Daejeon-si (KR); Chun Sik Chung, Suwon-si (KR); Yong Goo Kim, Daejeon-si (KR); Jae Wan Kim, Daejeon-si (KR); Chol Ho Kim, Daejeon-si (KR); Moon Young Kim, Daejeon-si (KR); Jun Ho Kim, Daejeon-si (KR); Jin Sik Park, Daejeon-si (KR)

(73) Assignee: SILICON WORKS CO., LTD., Daejeon-si (KR)

(*) Notice: Subject to any disclaimer, the term of this patent is extended or adjusted under 35 U.S.C. 154(b) by 1012 days.

(21) Appl. No.: 13/690,922

(22) Filed: Nov. 30, 2012

(65) Prior Publication Data
US 2013/0138370 A1   May 30, 2013

(30) Foreign Application Priority Data
Nov. 30, 2011 (KR) .................. 10-2011-0126771

(51) Int. Cl.
*G01R 31/36* (2006.01)
*G01R 31/3842* (2019.01)
*G05B 11/01* (2006.01)

(52) U.S. Cl.
CPC ....... *G01R 31/3842* (2019.01); *G01R 31/361* (2013.01); *G01R 31/3624* (2013.01); *G01R 31/3651* (2013.01); *G05B 11/01* (2013.01)

(58) Field of Classification Search
CPC ............. G01R 31/3624; G01R 31/361; G01R 31/3651; G05B 11/01
See application file for complete search history.

(56) References Cited

U.S. PATENT DOCUMENTS 5,281,919 A * 1/1994 Palanisamy .......... G01R 31/007
                                                    324/427
5,373,457 A * 12/1994 George ................ G09B 23/186
                                                    327/334
(Continued)

FOREIGN PATENT DOCUMENTS

DE   102011017113 A1 * 10/2012 ......... G01R 31/3651
JP   6-138195         5/1994
(Continued)

OTHER PUBLICATIONS

Calkins, Keith. Andrews University. http://www.andrews.edu/~calkins/math/edrm611/edrm06.htm. 2005.*

(Continued)

*Primary Examiner* — Michael J Dalbo
(74) *Attorney, Agent, or Firm* — Kile Park Reed & Houtteman PLLC

(57) ABSTRACT

Provided are a battery state-of-charge (SOC) estimation method and a battery management system which are capable of estimating an SOC using an inexpensive processor and a small-capacity memory. The SOC estimation method includes an SOC table creation step, an SOC calculation step, an SOC comparison step, and a processing step. The battery management system includes a battery, a sensing resistor, a control switch unit, and a processor.

14 Claims, 8 Drawing Sheets

(56) References Cited

U.S. PATENT DOCUMENTS

| | | | |
|---|---|---|---|
| 6,388,447 B1* | 5/2002 | Hall | H02J 7/0047 324/426 |
| 7,362,076 B2* | 4/2008 | Namba | G01R 31/3651 320/149 |
| 7,985,553 B2* | 7/2011 | Heintz | C12N 15/1006 435/6.12 |
| 8,129,944 B2* | 3/2012 | Izumi | B60L 11/1868 320/116 |
| 8,175,826 B2* | 5/2012 | Kang | G01R 31/36 702/63 |
| 8,447,544 B2* | 5/2013 | Hsu | G01R 31/3651 320/134 |
| 9,130,377 B2* | 9/2015 | Barsukov | H02J 7/0016 |
| 2001/0035738 A1* | 11/2001 | Laig-Horstebrock | G01R 31/3668 320/132 |
| 2002/0196026 A1* | 12/2002 | Kimura | G01R 31/361 324/426 |
| 2003/0040861 A1* | 2/2003 | Bellinger | G01G 19/086 701/51 |
| 2004/0128086 A1* | 7/2004 | Barsoukov | G01R 31/3651 702/63 |
| 2006/0111870 A1* | 5/2006 | Plett | G01R 31/3651 702/181 |
| 2006/0139007 A1* | 6/2006 | Kim | G01R 31/36 320/134 |
| 2007/0145948 A1* | 6/2007 | Lim | B60L 11/1887 320/132 |
| 2007/0159137 A1* | 7/2007 | Verbrugge | G01R 31/361 320/132 |
| 2009/0254290 A1* | 10/2009 | Kim | G01R 31/361 702/63 |
| 2010/0072948 A1* | 3/2010 | Sun | G01R 31/3651 320/134 |
| 2010/0085009 A1* | 4/2010 | Kang | H01M 10/482 320/118 |
| 2010/0174499 A1* | 7/2010 | Kang | G01R 31/36 702/63 |
| 2010/0244886 A1* | 9/2010 | Kawahara | G01R 31/361 324/764.01 |
| 2011/0127960 A1* | 6/2011 | Plett | H01M 10/482 320/116 |
| 2011/0130985 A1* | 6/2011 | Plett | G01R 31/3651 702/63 |
| 2011/0156713 A1* | 6/2011 | Akamine | G01R 31/3648 324/433 |
| 2011/0221400 A1* | 9/2011 | Takizawa | B60L 11/1816 320/166 |
| 2011/0226559 A1* | 9/2011 | Chen | G01R 31/3651 187/290 |
| 2012/0072146 A1* | 3/2012 | Hsu | G01R 31/3651 702/63 |
| 2012/0112754 A1* | 5/2012 | Kawai | G01R 31/3651 324/428 |
| 2013/0138369 A1* | 5/2013 | Papana | G01R 31/3644 702/63 |
| 2013/0138370 A1* | 5/2013 | Oh | G01R 31/3624 702/63 |
| 2013/0166235 A1* | 6/2013 | Oh | G01R 31/3624 702/63 |
| 2014/0278167 A1* | 9/2014 | Frost | G01R 31/3624 702/63 |

FOREIGN PATENT DOCUMENTS

| | | | |
|---|---|---|---|
| JP | 2001-231179 | | 8/2001 |
| JP | 2003-157912 | | 5/2003 |
| JP | 2007-187534 | | 7/2007 |
| JP | 2008-62913 | | 3/2008 |
| JP | 2010-127729 | | 6/2010 |
| JP | 2013113852 A | * | 6/2013 |
| JP | 2013113853 A | * | 6/2013 |
| KR | 10-2009-0020470 | | 2/2009 |

OTHER PUBLICATIONS

Wei et al. "Internal Resistance Identification in vehicle Power Lithium-ion Battery and Application in Lifetime Evaluation", DOI. 1109/ICMTMA.1009.468, IEEE computer society. 2009.*

Sack ,"Sack, Thomas; Johnson, Valerie; and Pesaran, Ahmad;" Temperature-Dependent Battery Models for High-Power Lithium Ion Batteries. Presented at the 17th Annual Electric Vehicle Symposium Montreal Canada Oct. 15-18, 2000.*

Calkins, Andrews University. http://www.andrews.edu/ ~calkins/math/edrm611/edrm06.htm. 2005.*

Plett, Extended Kalman filtering for battery management systems of LiPB-based HEV battery packs Part 2. Modeling and identification, Journal of Power Sources 134 (2004) 262-276.*

* cited by examiner

| 0.429x+3.703 | 0.351x+3.709 | 0.068x+3.762 | 0.234x+3.663 | 0.367X+3.567 |
| --- | --- | --- | --- | --- |
| 0.429x+3.701 | 0.312x+3.714 | 0.068x+3.764 | 0.273x+3.641 | 0.29x+3.634 |
| 0.39x+3.703 | 0.078x+3.712 | 0.068x+3.744 | 0.234x+3.661 | 0.345x+3.595 |

| 0.448x+3.465 | 0.195x+3.678 | 0.117x+3.718 | 0.176x+3.706 | 0.195X+3.702 |
| 0.410x+3.520 | 0.195x+3.677 | 0.039x+3.751 | 0.137x+3.721 | 0.312x+3.700 |
| 0.449x+3.481 | 0.195x+3.674 | 0.039x+3.751 | 0.013x+3.723 | 0.39x+3.689 |

Sensing Period

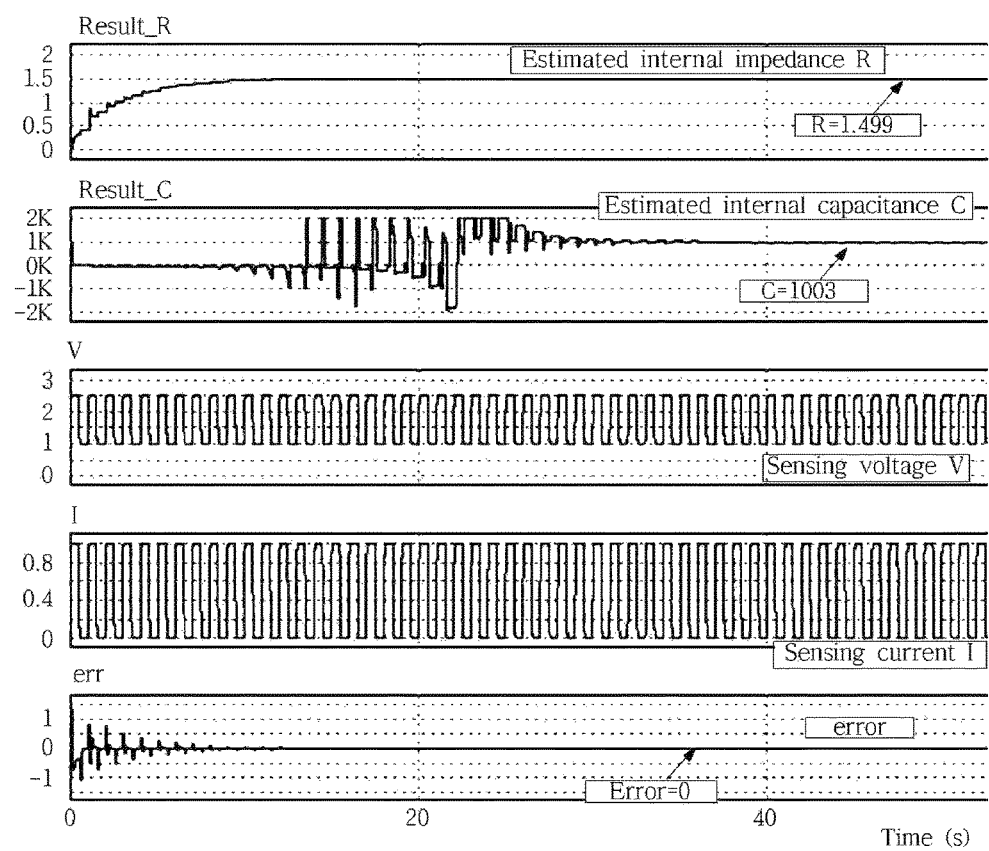

| SOC (%) | 10°C | 25°C | 50°C |
|---|---|---|---|
| 0 | 3.7 | 3.702 | 3.703 |
| 10 | 3.744 | 3.746 | 3.741 |
| 20 | 3.777 | 3.776 | 3.761 |
| 30 | 3.785 | 3.783 | 3.772 |
| 40 | 3.79 | 3.788 | 3.778 |
| 50 | 3.799 | 3.797 | 3.786 |
| 60 | 3.812 | 3.81 | 3.802 |
| 70 | 3.834 | 3.828 | 3.826 |
| 80 | 3.863 | 3.853 | 3.854 |
| 90 | 3.894 | 3.899 | 3.906 |
| 100 | 3.923 | 3.932 | 3.942 |

OCV-SOC table Created by Conventional Method

1220

| SOC(%) | 10°C | 25°C | 50°C |
|---|---|---|---|
| 0~14 | $0.429x + 3.703$ | $0.429x + 3.703$ | $0.39x + 3.703$ |
| 14~22 | $0.312x + 3.714$ | $0.351x + 3.709$ | $0.078x + 3.742$ |
| 22~60 | $0.068x + 3.764$ | $0.068x + 3.762$ | $0.068x + 3.744$ |
| 60~80 | $0.273x + 3.641$ | $0.234x + 3.663$ | $0.234x + 3.661$ |
| 80~100 | $0.29x + 3.634$ | $0.367x + 3.567$ | $0.345x + 3.595$ |

Linearized OCV-SOC table

1230

| SOC (%) | 10°C | 25°C | 50°C | max error |
|---|---|---|---|---|
| 0 | 3.703 | 3.703 | 3.703 | 1mV |
| 10 | 3.7459 | 3.7459 | 3.742 | 1mV |
| 20 | 3.7764 | 3.7792 | 3.7576 | 3mV |
| 30 | 3.7844 | 3.7824 | 3.7644 | 1mV |
| 40 | 3.7912 | 3.7892 | 3.7712 | 7mV |
| 50 | 3.798 | 3.796 | 3.778 | 8mV |
| 60 | 3.8048 | 3.8028 | 3.7848 | 2mV |
| 70 | 3.8231 | 3.8268 | 3.8248 | 1mV |
| 80 | 3.8594 | 3.8502 | 3.8482 | 6mV |
| 90 | 3.895 | 3.8973 | 3.9055 | 2mV |
| 100 | 3.924 | 3.934 | 3.94 | 2mV |

OCV-SOC table Created by Proposed Method

FIG. 13

| SOC (%) | 10°C | 25°C | 50°C |
|---|---|---|---|
| 0 | 3.692 | 3.693 | 3.692 |
| 10 | 3.732 | 3.735 | 3.722 |
| 20 | 3.752 | 3.753 | 3.74 |
| 30 | 3.761 | 3.761 | 3.756 |
| 40 | 3.768 | 3.767 | 3.765 |
| 50 | 3.778 | 3.776 | 3.778 |
| 60 | 3.794 | 3.791 | 3.795 |
| 70 | 3.817 | 3.813 | 3.818 |
| 80 | 3.846 | 3.839 | 3.852 |
| 90 | 3.888 | 3.883 | 3.904 |
| 100 | 3.932 | 3.929 | 3.941 |

OCV-SOC table Created by Conventional Method

| SOC(%) | 10°C | 25°C | 50°C |
|---|---|---|---|
| 0~12 | $0.312x + 3.700$ | $0.39x + 3.698$ | $0.195x + 3.702$ |
| 12~28 | $0.137x + 3.721$ | $0.13x + 3.723$ | $0.176x + 3.706$ |
| 28~52 | $0.39x + 3.751$ | $0.039x + 3.751$ | $0.117x + 3.718$ |
| 52~74 | $0.195x + 3.677$ | $0.195x + 3.674$ | $0.195x + 3.678$ |
| 74~100 | $0.410x + 3.520$ | $0.449x + 3.481$ | $0.488x + 3.465$ |

Linearized OCV-SOC table

| SOC (%) | 10°C | 25°C | 50°C | max error |
|---|---|---|---|---|
| 0 | 3.7 | 3.698 | 3.702 | 1mV |
| 10 | 3.7312 | 3.737 | 3.715 | 2mV |
| 20 | 3.7484 | 3.749 | 3.7412 | 4mV |
| 30 | 3.7627 | 3.7627 | 3.7531 | 3mV |
| 40 | 3.7666 | 3.7666 | 3.7648 | 1mV |
| 50 | 3.7705 | 3.7705 | 3.7765 | 9mV |
| 60 | 3.794 | 3.791 | 3.795 | 2mV |
| 70 | 3.8135 | 3.8105 | 3.8145 | 4mV |
| 80 | 3.8848 | 3.8402 | 3.8554 | 3mV |
| 90 | 3.889 | 3.8851 | 3.9042 | 2mV |
| 100 | 3.93 | 3.93 | 3.953 | 8mV |

OCV-SOC table Created by Proposed Method

BATTERY STATE-OF-CHARGE ESTIMATION METHOD AND BATTERY MANAGEMENT SYSTEM

CROSS REFERENCE TO RELATED APPLICATIONS

The present application claims priority of Korean Patent Application No. 10-2011-0126771, filed on Nov. 30, 2011, which is incorporated herein by reference in its entirety.

BACKGROUND OF THE INVENTION

Field of the Invention

The present invention relates to battery charge and discharge management, and more particularly, to a battery state-of-charge (SOC) estimation method using a current integral method and a battery open-circuit voltage and a battery management system using the same.

Description of the Related Art

When a secondary battery such as a lithium ion battery used as a power source of an electric driving motor of a hybrid electric vehicle is excessively discharged, the secondary battery may permanently lose the battery's characteristics. Furthermore, when the secondary battery is excessively charged, explosion or fire may occur. Therefore, attention must be paid to charging and discharging. In order to stably charge and discharge a battery, it is necessary to estimate the current state of the battery, that is, the SOC of the battery.

SUMMARY OF THE INVENTION

Accordingly, the present invention has been made in an effort to solve the problems occurring in the related art, and an object of the present invention is to provide a battery SOC estimation method capable of estimating an SOC using an inexpensive processor and a small-capacity memory.

Another object of the present invention is to provide a battery management system capable of estimating an SOC using an inexpensive processor and a small-capacity memory.

In order to achieve the above object, according to one aspect of the present invention, there is provided a battery SOC estimation including an SOC table creation step, an SOC calculation step, an SOC comparison step, and a processing step.

In the SOC table creation step, the entire area of a two-dimensional coordinate system representing a relation between battery open-circuit voltages and battery SOCs is divided into a plurality of steps at a plurality of different temperatures at a time point when a battery is charged or discharged, and function information representative of the relation between battery open-circuit voltages and battery SOCs for each step is stored in an SOC table. In the SOC calculation step, an initial SOC extracted by using the function information stored in the SOC table, parameters of elements used in a battery equivalent model, an open-circuit voltage of the battery, and an amount of current inputted to or outputted from the battery are applied to a current integral equation to calculate an SOC of the battery. In the SOC comparison step, an SOC corresponding to the open-circuit voltage applied at the SOC calculation step is extracted using the function information stored in the SOC table, and the extracted SOC and the calculated SOC are compared. In the processing step, the calculated SOC is displayed when a difference between the extracted SOC and the calculated SOC is smaller than a critical value.

According to another aspect of the present invention, there is provided a battery management system including a sensing resistor, a control switch unit, and a processor.

The sensing resistor is connected to one end of a battery. The control switch unit is configured to transmit a current supplied from a current source to the battery or transmit a current outputted from the battery to a load, in response to a control signal. The processor is configured to generate the control signal, calculate parameters of elements applied to an equivalent model of the battery using a measured temperature of the battery, a current of the battery, and an open-circuit voltage of the battery, and create and store an SOC table using the temperature and the open-circuit voltage of the battery.

BRIEF DESCRIPTION OF THE DRAWINGS

The above objects, and other features and advantages of the present invention will become more apparent after a reading of the following detailed description taken in conjunction with the drawings, in which:

FIG. 11 illustrates computer simulation results for the battery equivalent model;

FIG. 12 shows a case in which the battery SOC estimation method in accordance with the embodiment of the present invention is applied during charging; and FIG. 13 shows a case in which the battery SOC estimation method in accordance with the embodiment of the present invention is applied during discharging.

DETAILED DESCRIPTION OF PREFERRED EMBODIMENTS

Figure 1:
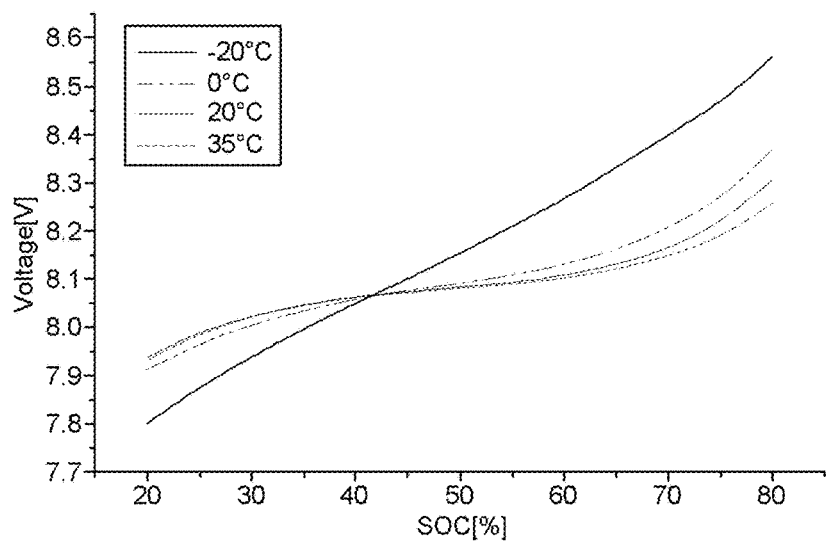
FIG. 1 is a graph illustrating the relation between open-circuit voltages and SOCs of a battery, based on temperatures when the battery is charged.

Reference will now be made in greater detail to a preferred embodiment of the invention, an example of which is illustrated in the accompanying drawings. Wherever possible, the same reference numerals will be used throughout the drawings and the description to refer to the same or like parts.

FIG. 1 is a graph illustrating the relation between open-circuit voltages and SOCs of a battery, based on temperatures when the battery is charged.

Referring to FIG. 1, it can be seen that when the voltage level of an open-circuit voltage of the battery represented on a y-axis increases, the SOC of the battery represented on an x-axis also increases under four temperature conditions (−20° C., 0° C., 20° C., and 35° C.). In FIG. 1, different increase tendencies are observed depending on the temperature. However, when the voltage level of the open-circuit voltage increases, the SOC of the battery also increase under all of the temperature conditions.

In the embodiments of the present invention, the relation among the temperature of the battery, the open-circuit voltage of the battery, and the SOC of the battery during charging may be processed to minimize the amount of basic data used for calculating the SOC of the battery, and the data used for calculating the SOC of the battery may be simply updated, if necessary.

Hereafter, the open-circuit voltage of the battery will be used as the same concept as the voltage level of the open-circuit voltage of the battery unless otherwise noted.

For easy understanding of the present invention, the relation between open-circuit voltage and SOC of the battery at an arbitrary temperature will be described.

Figure 2:
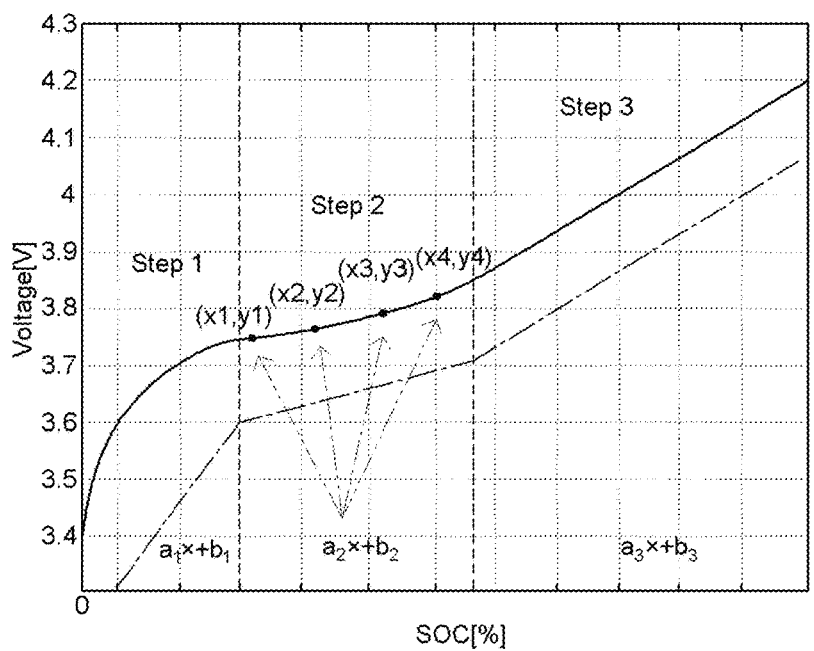
FIG. 2 illustrates steps used in a battery SOC estimation method in accordance with an embodiment of the present invention, when the battery is charged.

FIG. 2 illustrates steps used in a battery SOC estimation method in accordance with an embodiment of the present invention, when the battery is charged.

When battery SOCs corresponding to battery open-circuit voltages are connected through a line, the relation between the open-circuit voltages and the SOCs may be indicated by a solid line. The increase tendency of the battery SOC, indicated by a solid line and based on the increase of the battery open-circuit voltage, may differ for each step. For convenience of description, FIG. 2 illustrates three steps Step1, Step2, and Step3.

In each of the three steps distinguished by vertical dotted lines, a solid line exhibits a constant increase tendency. Although the increase tendency is non-linear, the increase tendency may be schematically expressed as a linear function (dotted line) corresponding to the increase tendency. The linear function may be expressed as Equation 1 below.

$$y = ax + b \quad \text{[Equation 1]}$$

Here, x and y represent variables, a represents a gradient, and b represents an intercept.

When the gradient and intercept of the first step Step1 among the three steps illustrated in FIG. 2 are represented by $a_1$ and $b_1$, the gradients and intercepts of the second and third steps Step2 and Step3 may be represented by $a_2$ and $b_2$ and $a_3$ and $b_3$, respectively.

Hereafter, a method for calculating the gradient and intercept of the second step Step 2 will be described. The gradient a and the intercept b of a linear function corresponding to a line segment connecting four points decided by four battery open-circuit voltages $y_1$, $y_2$, $y_3$, and $y_4$ and four battery SOCs $x_1$, $x_2$, $x_3$, and $x_4$ corresponding to the battery open-circuit voltages $y_1$, $y_2$, $y_3$, and $y_4$ may be calculated by Equations 2 and 3 below, respectively.

$$a = \frac{n\sum x_i y_i - \sum x_i \sum y_i}{n\sum x_i^2 - (\sum x_i)^2} \quad \text{[Equation 2]}$$

$$b = \frac{\sum y_i \sum x_i^2 - \sum x_i \sum x_i y_i}{n\sum x_i^2 - (\sum x_i)^2} \quad \text{[Equation 3]}$$

Here, i represents a variable for distinguishing the four SOCs and the four open-circuit voltages which are applied to Equations 2 and 3. When four-point data are used, i has a value of 1 to 4. Thus, a natural number n becomes four.

In order to increase the precision of data on the SOCs, the increase tendency may be divided into a larger number of steps than three steps. In this case, however, data to be stored in an SOC table inevitably increases. Therefore, the amount of data to be stored in the SOC table and the SOC estimation have a trade-off relation.

In this embodiment of the present invention, the characteristic line segment of the battery open-circuit voltages and the battery SOCs is divided into a plurality of steps having the same or similar gradient, and function information corresponding to each step, that is, the gradient and intercept of a linear function are applied when the SOC table is created. Therefore, the amount of data stored in the SOC table may be minimized.

Figure 3:
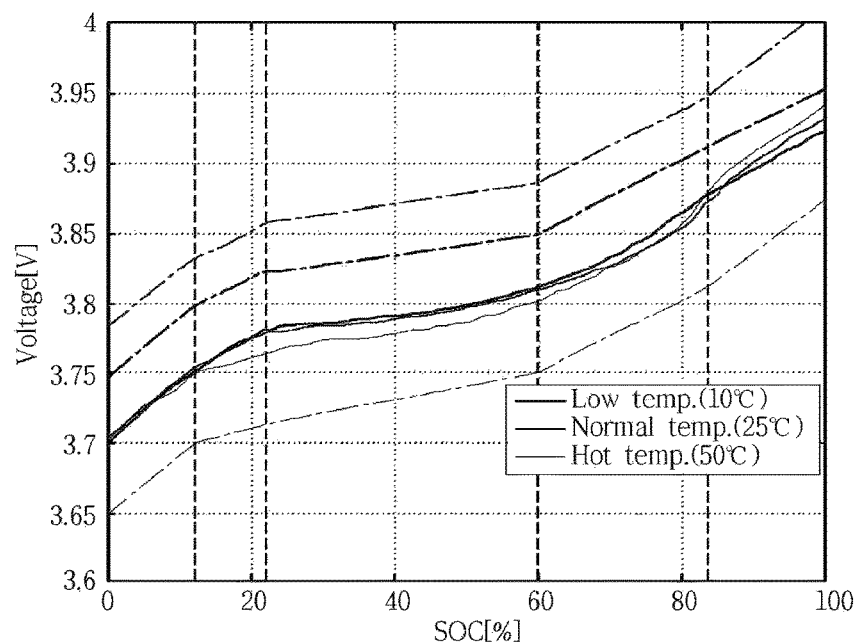
FIG. 3 illustrates the relations between battery open-circuit voltages and battery SOCs at three different temperatures when the battery is charged.

FIG. 3 illustrates the relations between battery open-circuit voltages and battery SOCs at three different temperatures when the battery is charged.

In FIG. 3, an upper diagram is a graph illustrating the relations between three battery open-circuit voltages and battery SOCs, and a lower table shows the graph divided into five steps, using functions for the respective steps.

Referring to the upper diagram of FIG. 3, three solid lines indicate the relation between battery open-circuit voltages and battery SOCs at three different battery temperatures (10° C., 25° C., and 50° C.), respectively, and three dotted lines are lines obtained by linearizing the three solid lines. Among the three dotted lines of the upper diagram, the dotted line positioned at the top is obtained by linearizing the solid line of the normal temperature (25° C.), and the dotted lines positioned at the middle and bottom are obtained by linearizing the solid lines of the low and high temperatures (10° C. and 50° C.).

Referring to the lower table, the linearized dotted line of the normal temperature (25° C.) positioned at the top in the upper diagram has a gradient and intercept of 0.429 and 3.703 in the first step, a gradient and intercept of 0.429 and 3.703 in the second step, and a gradient and intercept of 0.068 and 3.762 in the third step.

Figure 4:
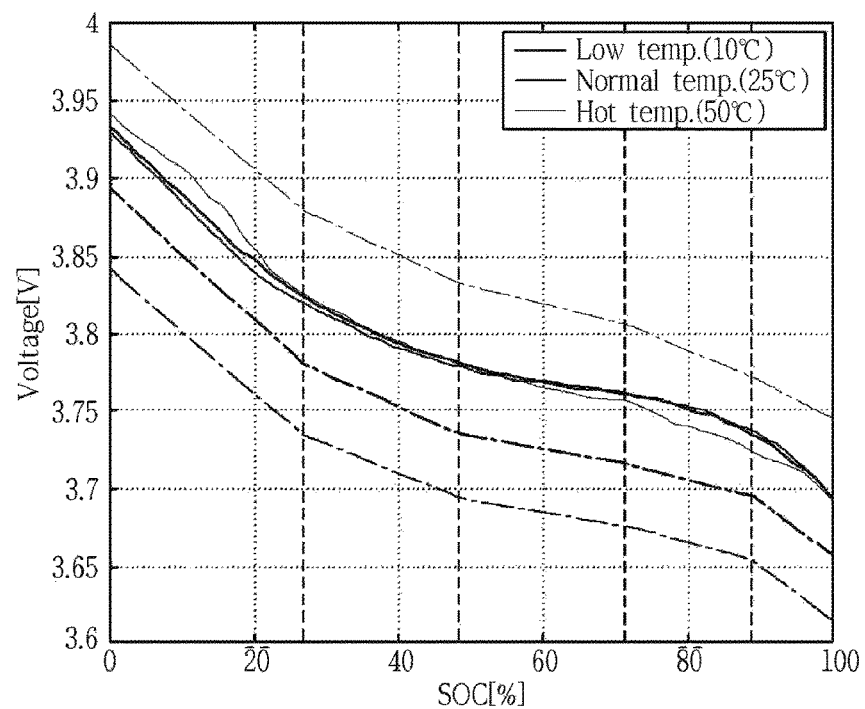
FIG. 4 illustrates the relations between battery open-circuit voltages and battery SOCs at three different temperature conditions when the battery is discharged.

FIG. 4 illustrates the relations between battery open-circuit voltages and battery SOCs at three different temperature conditions when the battery is discharged.

In FIG. 4, an upper diagram is a graph illustrating the relation between three battery open-circuit voltages and battery SOCs, and a lower table shows the graph divided into five steps, using functions for the respective steps.

Referring to the upper diagram of FIG. 4, three solid lines indicate the relations between battery open-circuit voltages and battery SOCs at three different battery temperatures (10° C., 25° C., and 50° C.), respectively, during charging, and three dotted lines are obtained by linearizing the three solid lines. Among the three dotted lines of the upper diagram, the dotted line positioned at the top is obtained by linearizing the solid line of the high temperature (55° C.), and the dotted lines positioned at the middle and bottom are obtained by linearizing the solid lines of the low and normal temperatures (10° C. and 25° C.).

Referring to the lower table, the linearized dotted line of the high temperature (50° C.) positioned at the top in the upper diagram has a gradient and intercept of 0.488 and 3.465 in the first step and a gradient and intercept of 0.117 and 3.718 in the third step. In the lower table, the signs of the gradients are omitted. However, since the gradients indicate a decrease tendency, the gradients have negative values. However, the signs are omitted herein, for convenience of description.

The gradients and intercepts of the respective steps obtained by dividing line segments exhibiting different characteristics depending on three temperature conditions in FIGS. 3 and 4 may be easily calculated by Equations 2 and 3. Therefore, the detailed descriptions thereof are omitted herein.

In the above-described embodiment, each step is replaced with a linear function. However, each step may be expressed as a quadratic function when relatively accurate data are required, and data on the quadratic function may be reflected into the SOC table. From the descriptions of the linear function, the technical idea for the quadratic function may be derived.

Figure 5:
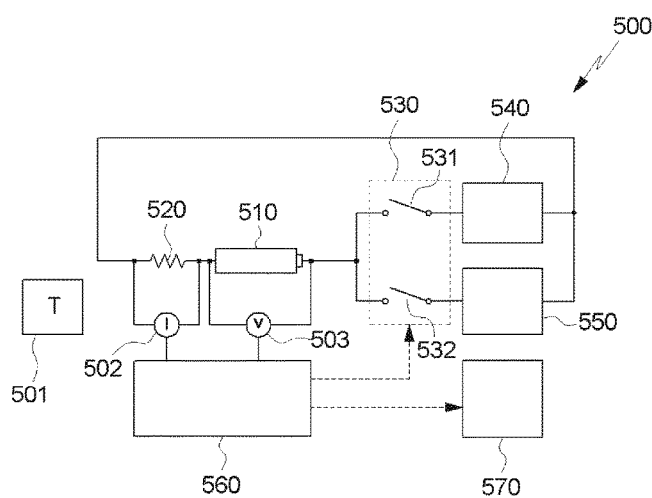
FIG. 5 illustrates a battery management system in accordance with another embodiment of the present invention.

FIG. 5 illustrates a battery management system in accordance with another embodiment of the present invention.

Referring to FIG. 5, the battery management system 500 in accordance with the embodiment of the present invention includes a thermometer 501, an amperemeter 502, a voltmeter 503, a battery 510, a sensing resistor 520, a control switch unit 530, a current source 540, a load 550, a processor 560, and a user interface device 570.

The thermometer 501 is configured to measure the temperature of the battery 510, the amperemeter 502 is configured to detect the amount of current inputted to or outputted from the battery 510, and the voltmeter 503 is configured to measure a voltage applied across the battery, that is, an open-circuit voltage.

The sensing resistor 520 is connected to an end of the battery 510, and used to measure the amount of current supplied to the battery 510 and the amount of current outputted from the battery 510.

The control switch unit 530 is configured to transmit a current supplied from the current source 540 to the battery 510 or transmit a current outputted from the battery 510 to the load 550, in response to a charge control signal and a discharge control signal which are generated from the processor 560. The control switch unit 530 includes a charge control switch 531 and a discharge control switch 532. The charge control switch 531 is configured to switch a current supplied from the current source 540 to the battery in response to the charge control signal, and the discharge control switch 532 is configured to switch a current outputted from the battery 510 to the load 550 in response to the discharge control signal.

The processor 560 is configured to perform the following operations.

First, the processor 560 generates the charge control signal and the discharge control signal to control the switching operations of the two switches 531 and 532 included in the switch control unit 530.

Second, the processor 560 monitors the temperature of the battery, a current supplied to the battery or outputted from the battery, and an open-circuit voltage of the battery, and calculates parameters of elements applied to an equivalent model of the battery using the monitored temperature, current, and open-circuit voltage of the battery. At this time, in order to calculate the parameters of the elements applied to the equivalent model, the processor 560 controls the charge control signal such that the current supplied to the battery is applied in a pulse form having a constant frequency during a part of the steps in which the battery is charged, and controls the discharge control signal such that the current supplied to the load from the battery is applied in a pulse form having a constant frequency during a part of the steps in which the battery is discharged.

Third, the processor 560 creates and stores an SOC table using the monitored temperature and open-circuit voltage of the battery. The processor 560 represents the relations between battery open-circuit voltages and battery SOCs on a two-dimensional coordinate system at a plurality of different temperature during charging and discharging of the battery, divides steps in which the increase tendencies or decrease tendencies of the data represented on the two-dimensional coordinate system are different from each other, and stores the gradient and intercept of a linear function representative of the relation between battery open-circuit voltages and battery SOCs for each step in the SOC table.

The processor 560 calculates the current SOC of the battery using the temperature of the battery, the open-circuit voltage of the battery, and the gradients and intercepts of the linear functions stored in the SOC table, extracts the SOC based on the open-circuit voltage of the battery when the SOC of the battery was calculated, by referring to the SOC table, and displays the calculated SOC when a difference between the calculated SOC and the extracted SOC is smaller than a predetermined critical value.

When the difference between the calculated SOC and the extracted SOC is larger than the critical value, the processor 560 may selectively perform one of the following two operations.

First, the processor 560 issues a command to immediately update the SOC table.

Second, the processor 560 issues a command to display the calculated SOC and the fact that the difference between the calculated SOC and the extracted SOC is larger than the critical value. In this case, the processor 560 issues a command to store the number of errors in which the fact that the difference between the calculated SOC and the extracted SOC is larger than the critical value is detected, and update the data stored in the SOC table when the number of errors is larger than a predetermined reference number.

The user interface device 570 such as a personal computer handles a part of the functions performed by the processor 560, and may be added to a system, if necessary. That is, the user interface device 570 divides the entire region of the two-dimensional coordinate system representing the relation between battery open-circuit voltages and battery SOCs into a plurality of steps at a plurality of different temperature during charging and discharging of the battery, calculates the gradient and intercept of a linear function representative of the relation between battery open-circuit voltages and battery SOCs for each step, and transmits the calculation result to the processor 560.

Figure 6:
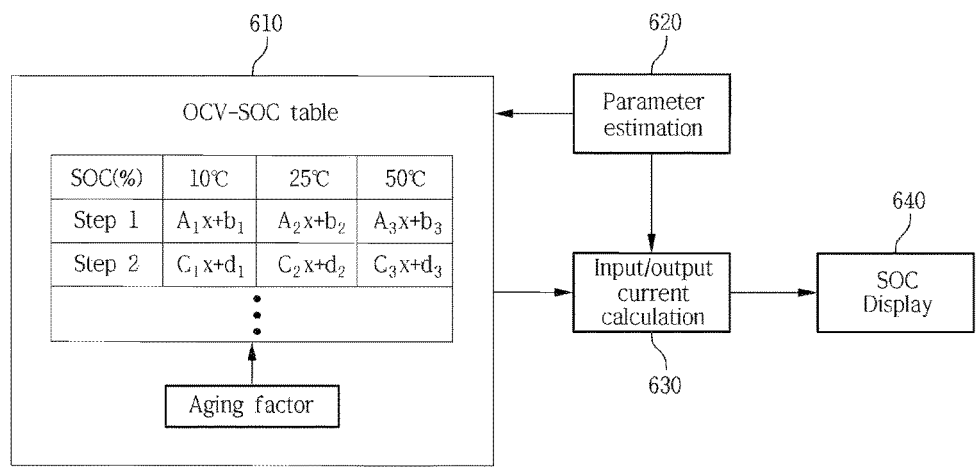
FIG. 6 is a diagram for explaining the operation concept of the battery management system in accordance with the embodiment of the present invention.

FIG. 6 is a diagram for explaining the operation concept of the battery management system in accordance with the embodiment of the present invention.

Referring to FIG. 6, the battery management system in accordance with the embodiment of the present invention creates and stores an SOC table 610, estimates parameters of a battery equivalent model (parameter estimation 620), calculates the amount of current inputted to or outputted from the battery (input/output current calculation 630), and displays the SOC (SOC display 640).

When the descriptions based on FIGS. 3 and 4 are applied, the SOC table 610 is divided into three steps Step1 to Step3, and the temperature of the battery is divided into three temperature conditions (10° C., 25° C., and 50° C.). The parameter estimation 620 for the battery equivalent model is performed by estimating resistance R of an internal resistor of the battery and capacitance C of an internal capacitor of the battery using a recursive least square method. An initial SOC $SOC_0$ of the battery is extracted using the gradients and intercepts stored in the SOC table 610, and the amount of current inputted to or outputted from the battery is calculated (630). Then, the initial SOC $SOC_0$ and the current amount are summed to calculate the current SOC of the battery. In this embodiment of the present invention, the calculation of the SOC during discharging is performed by a current integral equation expressed as Equation 4 below.

$$SOC(t) = SOC_0 - \frac{1}{C}\int_{t_0}^{t} \eta I(t)d\tau \quad \text{[Equation 4]}$$

Here, SOC(t) represents an SOC at a time t, $SOC_0$ represents the initial $SOC_0$ extracted by using the gradients and intercepts of the linear functions stored in the SOC table, C represents the capacitance of the internal capacitor corresponding to one of elements applied to the battery equivalent model, I(t) represents a current inputted to the battery or outputted from the battery at a time t, and η(eta) represents the charge/discharge efficiency of the battery.

When the minus sign (−) of Equation 4 is replaced with a plus sign (+), Equation 4 may be applied even during discharging.

The calculated SOC is displayed on a predetermined display device (640).

Figure 7:
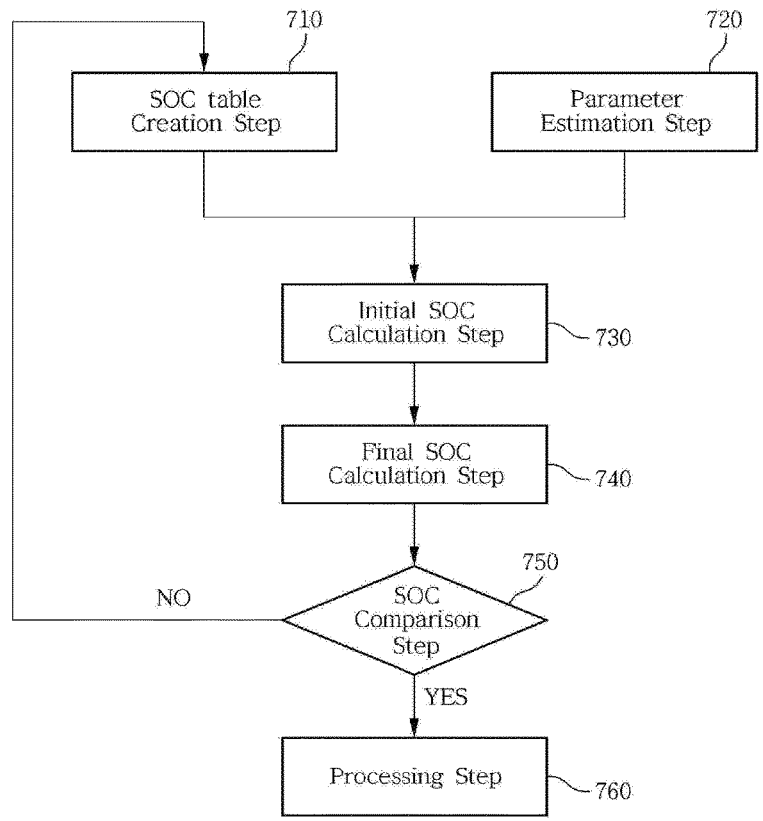
FIG. 7 is a flow chart showing the battery SOC estimation method in accordance with the embodiment of the present invention.

FIG. 7 is a flow chart showing the battery SOC estimation method in accordance with the embodiment of the present invention.

Referring to FIG. 7, the battery SOC estimation method 700 includes an SOC table creation step S710, a parameter estimation step S720 of estimating parameters of the elements used for the equivalent model, SOC calculation steps S730 and S740, SOC comparison step S750, and a processing step S760.

At the SOC table creation step S710, the entire region of the two-dimensional coordinate system representing the relations between battery open-circuits and battery SOCs at different temperatures during charging and discharging of the battery is divided into a plurality of steps, and the gradient and intercept of a linear function representative of the relation between battery open-circuit voltages and battery SOCs for each step are stored in the SOC table.

At the parameter estimation step S720, an open-circuit voltage of the battery and a current inputted to the battery or outputted from the battery are measured to calculate the resistance R of the internal resistor 1002 applied to the battery equivalent model and the capacitance C of the internal capacitor 1001.

At the SOC calculation steps 730 and 740, the initial SOC extracted by using the gradients and intercepts of the linear functions stored in the SOC table, the parameters of the elements used for the battery equivalent model, the open-circuit voltage of the battery, and the amount of current inputted to or outputted from the battery are applied to the current integral equation expressed as Equation 8 below, in order to calculate the SOC of the battery.

At the SOC comparison step S750, an SOC corresponding to the open circuit-voltage of the battery at a time point t when the battery SOC was calculated using the gradients and intercepts of the linear functions stored in the SOC table is extracted. Then, the extracted SOC is compared to the calculated SOC. When a difference between the extracted SOC and the calculated SOC is larger than the critical value, the SOC table creation step S710 is updated.

At the processing step S760, when the difference between the extracted SOC and the calculated SOC is smaller than the critical value, the calculated SOC is displayed.

Although not shown in FIG. 7, the number of errors in which the fact that the difference between the extracted SOC and the calculated SOC is larger than the critical value is detected may be further displayed at the processing step S760. Furthermore, when the number of errors exceeds a predetermined reference number, the SOC table creation step may be updated.

Figure 8:
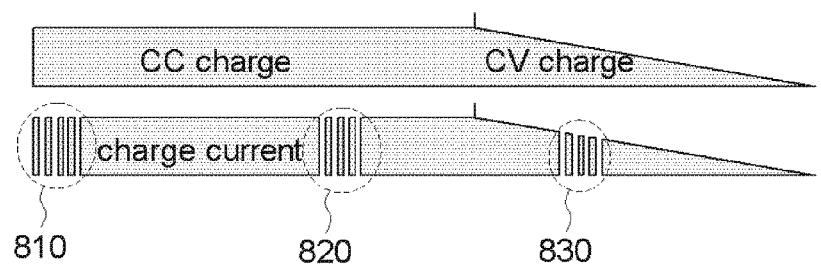
FIG. 8 illustrates a method for producing a current in a pulse form during a predetermined time period, when the battery is charged or discharged in the battery management system in accordance with the embodiment of the present invention.

FIG. 8 illustrates a method for producing a current in a pulse form during a predetermined time period, when the battery is charged or discharged in the battery management system in accordance with the embodiment of the present invention.

Referring to FIG. 8, the switch on/off of the charge control switch 530 is controlled by adjusting the charge control signal during some periods 810 and 820 of the entire period CC Charge in which the battery is charged, such that a current supplied to the battery 510 from the current source 540 has a pulse form. Furthermore, the switch on/off of the discharge control switch 532 is controlled by adjusting the discharge control signal during a period 830 of the entire period CV Charge in which the battery is discharged, such that a current supplied to the load 550 from the battery has a pulse form.

Figure 9:
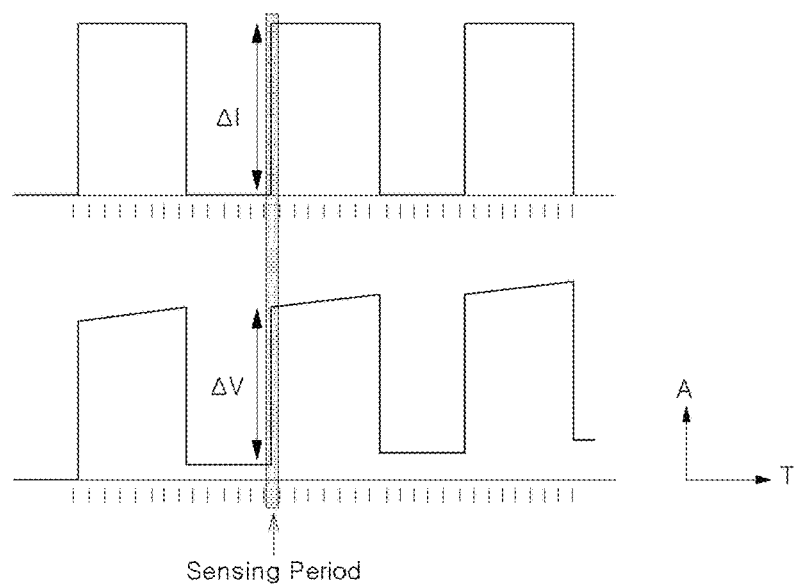
FIG. 9 illustrates a pulse-type current and a pulse-type open-circuit voltage.

FIG. 9 illustrates a pulse-type current and a pulse-type open-circuit voltage.

Referring to FIG. 9, when the current transits in a pulse form by ΔI, the open-circuit voltage also transits in a pulse form by ΔV. In the embodiment of the present invention, the current and the voltage level of the open-circuit voltage in a period including the period in which the current and the open-circuit voltage transit, that is, a sensing period are used to estimate the parameters of the elements forming the battery equivalent model.

The reason to supply the current in a pulse form as illustrated in FIGS. 8 and 9 is in order to use the relation between the amplitude of the supplied current and the amplitude of the corresponding battery open-circuit voltage when calculating the parameters of the elements forming the battery equivalent model. At this time, the frequency of the pulse is adjusted to decide the frequency of the pulse current to satisfy a condition at which the amplitude of the battery open-circuit voltage must be saturated before a time point (not illustrated) when the amplitude of the current supplied to the battery suddenly decreases.

Figure 10:
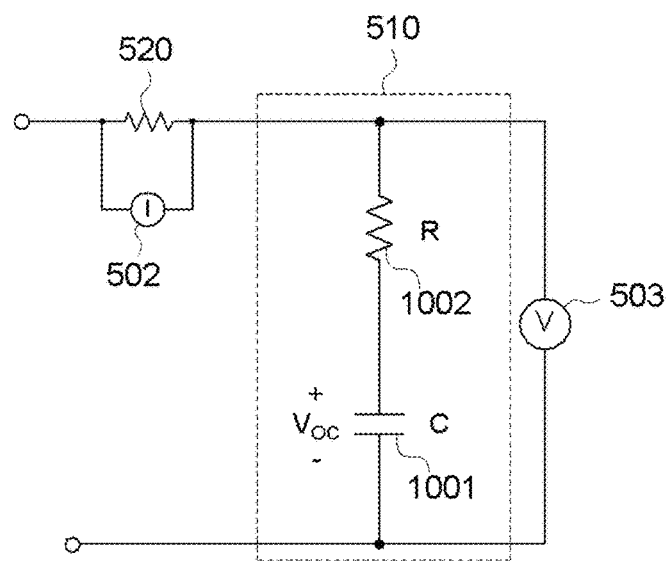
FIG. 10 illustrates the battery equivalent model.

FIG. 10 illustrates the battery equivalent model.

Referring to FIG. 10, the battery equivalent model 510 may include an internal resistor 1002 and the internal capacitor 1001. When supposing that the battery is defined as the equivalent model of FIG. 10, two parameters, that is, the resistance R of the internal resistor 1002 and the capacitance C of the internal capacitor 1001 may be calculated from Equation 5. The current flowing in the battery 510 is measured using the resistor 520 and the current source 502, and the voltage of the battery 520 is measured using the voltage source 501.

$$\begin{bmatrix} R + \frac{T_s}{C} \\ R \end{bmatrix} = \begin{bmatrix} R_0 + \frac{T_s}{C_0} \\ R_0 \end{bmatrix} + \quad \text{[Equation 5]}$$

-continued $$K_N \begin{bmatrix} i_k \\ i_{k-1} \end{bmatrix} \left( y_k - \left( \left( R_0 + \frac{T_s}{C_0} \right) i_k - R_0 i_{k-1} \right) \right)$$

Here, $T_S$ represents a sampling time, $y_k$ represents a battery open-circuit voltage measured at an arbitrary sampling moment k (k is a natural number), $i_k$ represents a current flowing in the battery at the arbitrary sampling moment, $i_{k-1}$ represents a current flowing in the battery just before the arbitrary sampling moment, and $R_0$ and $C_0$ represent initial values for calculating the resistance R of the internal resistor 1002 and the capacitance C of the internal capacitor 1001. A gain Kn of Equation 5 may be expressed as Equation 6 below.

$$K_N = \frac{1}{\frac{1+\lambda^4}{\varepsilon \lambda^3} \cdot A_N + (i_k^2 + i_{k-1}^2)} \begin{bmatrix} i_k \\ i_{k-1} \end{bmatrix} \qquad \text{[Equation 6]}$$

A compensation value $A_N$ of Equation 6 may be expressed as Equation 7 below.

$$A_N = \frac{1}{1 - A_{N-1}(i_k^2 + i_{k-1}^2)}, \qquad \text{[Equation 7]}$$
$$A_1 = 1, N = 1, 2, \ldots, n$$

Here, ε represents a covariance value, and λ represents a forgetting factor having a value between 0 and 1 and defines the importance of a current value rather than an existing value.

The resistance value R of the internal resistor 1002 and the capacitance C of the internal capacitor 1001, which are estimated by Equations 5 to 7, are applied to Equation 8 to calculate the battery opening-circuit voltage.

$$y = \left( R + \frac{T_s}{C} \right) i[k] - R i[k-1] \qquad \text{[Equation 8]}$$

When the least square method is applied to Equations 5 to 8, the gain $K_N$ of Equation 5 is adjusted until a difference $y - y_k$ between two open-circuit voltages y and $y_k$ calculated by Equations 5 and 8 is minimized. When the difference $y - y_k$ between the calculated open-circuit voltage y and the measured open-circuit voltage $y_k$ is minimized, the resistance R of the internal resistor and the capacitance C of the internal capacitor which are estimated from Equations 5 to 7 are fixed and stored as final values.

FIG. 11 illustrates computer simulation results for the battery equivalent model.

The simulation results illustrated in FIG. 11 were obtained under the supposition that the resistance of the resistor is 1.5Ω and the capacitance of the capacitor is 1000 pF in the battery equivalent model. The pulse current I is applied to the battery. At this time, the current I and the open-circuit voltage V are detected and then applied to Equations 5 to 7. Simultaneously, the recursive least square method is applied to perform the calculation. As a result, the error converges to 0 after a predetermined time passes, and the resistance Result_R of the internal resistor 1002 and the capacitance Result_C of the internal capacitor 1001 converge to values approximate to the values (R=1.499 and C=1003) assumed in the simulation. Through the experiment of FIG. 9, it is possible to check the effect of the present invention.

FIG. 12 shows a case in which the battery SOC estimation method in accordance with the embodiment of the present invention is applied during charging.

FIG. 13 shows a case in which the battery SOC estimation method in accordance with the embodiment of the present invention is applied during discharging.

Referring to FIG. 12, a conventional battery SOC table 1210 stores 11 open-circuit voltages corresponding to 11 SOCs of 0, 10, 20, 30, 40, 50, 60, 70, 80, 90, and 100 at temperatures of 10° C., 25° C., and 50° C., respectively, that is, total 33 open-circuit voltages. The SOC table 1220 in accordance with the embodiment of the present invention stores gradients and intercepts corresponding to SOCs in five steps of 0 to 14, 14 to 22, 22 to 60, 60 to 80, and 80 to 100 at temperatures 10° C., 25° C., and 50° C. Referring to FIG. 12, it can be seen that the amount of data stored in the conventional SOC table 1210 is larger than the amount of data stored in the SOC table 1220 used in the battery SOC estimation method in accordance with the embodiment of the present invention.

Although the data amount is smaller than in the conventional SOC table 1210, it can be seen that the SOC table 1230 including the data obtained at the respective temperatures of 10° C., 25° C., and 50° C. by applying the SOC estimation method in accordance with the embodiment of the present invention has almost the same values as the conventional SOC table 1210. Although a slight difference exists in some steps, this may be overcome by further subdividing the linearization steps. However, this may increase the number of SOC tables, thereby causing the increase in memory area. As described above, a proper trade-off is needed between accurate SOC estimation and the amount to be stored.

FIG. 13 may be easily understood through the descriptions with reference to FIG. 12. Therefore, the detailed descriptions thereof are omitted herein.

In the battery SOC estimation method and the battery management system in accordance with the embodiment of the present invention, since the amount of data stored in the SOC used for extracting the initial SOC is small, it is possible to estimate the SOC of the battery using a small-capacity memory.

Furthermore, as the computing amount required for calculating the current SOC of the battery using the data stored in the SOC table also decreases, a low-performance processor may be used to estimate the SOC. Therefore, it is possible to reduce a cost required for implementing the battery management system.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A battery state-of-charge (SOC) estimation method comprising:
    an SOC table creation step of dividing, by a processor, the entire area of a two-dimensional coordinate system representing a relation between battery open-circuit voltages and battery SOCs into a plurality of segments in which gradients of a linear function according to increase tendencies or decrease tendencies of data represented on the two-dimensional coordinate system are different from each other, at a time point when a battery is charged or discharged at a plurality of different temperatures, and storing, by the processor, function information representative of the relation between battery open-circuit voltages and battery SOCs for each segment in an SOC table;

a parameter estimation step comprising:
generating a control signal, by the processor, to control a control switch unit comprising, a charge control switch installed between the battery and a current source and a discharge control switch installed between the battery and a load receiving the current from the battery, said control signal generation being such that the current inputted to the battery from the current source or outputted from the battery to the load has a pulse form with a predetermined frequency, measuring, by the processor, an inputted current to the battery or an outputted current from the battery, an open circuit voltage of the battery, and a temperature of the battery, and calculating, by the processor, a resistance value of a resistor applied to a battery equivalent model and capacitance of a capacitor applied to the battery equivalent model;

an SOC calculation step of calculating, by the processor, an SOC of the battery using the function information and the measured current;

an SOC comparison step of acquiring, by the processor, a difference between an SOC extracted by using the function information, measured open circuit voltage of the battery, and measured temperature of the battery, and the SOC calculated at the SOC calculation step; and a processing step of displaying the calculated SOC when the difference acquired at the SOC comparison step is smaller than a critical value, displaying the calculated SOC and the fact that the difference between the extracted SOC and the calculated SOC is larger than the critical value when the difference between the extracted SOC and the calculated SOC is larger than the critical value and displaying the number of errors indicating that the difference between the extracted SOC and the calculated SOC is larger than the critical value, by the processor.

2. The battery SOC estimation method of claim 1, wherein the SOC table creation step further comprises:
a data measurement step of measuring, by the processor, battery SOCs based on a change of the battery open-circuit voltage at the plurality of different temperatures;
a data representation step of representing, by the processor, the battery SOCs based on the change of the battery open-circuit voltage, measured at the plurality of different temperatures at the data measurement step, on the two-dimensional coordinate system, and connecting, by the processor, the battery SOCs through a line;
a segment division step of dividing, by the processor, segments in which gradients of the linear function according to increase tendencies or decrease tendencies of the data represented on the two-dimensional coordinate system are different from each other; and
a linearization coefficient calculation step of acquiring, by the processor, the function information representative of each segment, and storing the acquired function information in the SOC table.

3. The battery SOC estimation method of claim 1, wherein the parameter estimation step further comprises:

when the current is inputted to the battery, turning on and off, by the processor, the charge control switch by a charge control signal having a predetermined frequency such that the current inputted to the battery has a pulse form with a predetermined frequency, during a predetermined time period of the entire time period in which the current is inputted to the battery, and when the current is outputted from the battery, turning on and off, by the processor, the discharge control switch by a discharge control signal having a predetermined frequency such that the current outputted from the battery has a pulse form with a predetermined frequency, during a predetermined time period of the entire time period in which the current is outputted from the battery.

4. The battery SOC estimation method of claim 3, wherein the parameter estimation step further comprises calculating the resistance value of the resistor applied to the battery equivalent model and the capacitance of the capacitor applied to the battery equivalent model, using a battery current and a battery open-circuit voltage in a period including a period in which the pulse-form current transits and a period in which the pulse-form open-circuit voltage transits in correspondence to the pulse-form current.

5. The battery SOC estimation method of claim 1, wherein the SOC calculation step further comprises applying, by the processor, an initial SOC extracted by using the function information stored in the SOC table, parameters of elements used in the battery equivalent model, an open-circuit voltage of the battery, and an amount of current inputted to or outputted from the battery to a current integral equation, and calculating, by the processor, an SOC of the battery.

6. The battery SOC estimation method of claim 1, wherein the SOC comparison step further comprises extracting, by the processor, an SOC corresponding to the open-circuit voltage applied at the SOC calculation step using the function information stored in the SOC table, and comparing, by the processor, the extracted SOC and the calculated SOC.

7. The battery SOC estimation method of claim 1, wherein the processing step further comprises issuing, by the processor, a command to update the SOC table creation step when the number of errors exceeds a predetermined reference number.

8. A battery management system comprising:
a sensing resistor connected to one end of a battery;
a control switch unit comprising, a charge control switch installed between the battery and a current source and a discharge control switch installed between the battery and a load receiving the current from the battery, and configured to transmit a current supplied from the current source to the battery or transmit a current outputted from the battery to the load, in response to a control signal; and
a processor configured to generate the control signal, and to measure an open-circuit voltage of the battery, a current inputted to the battery or outputted from the battery, and a temperature of the battery, the processor further configured to calculate parameters of elements applied to an equivalent model of the battery using a measured temperature of the battery, a measured current of the battery, and a measured open-circuit voltage of the battery, and create and store an SOC table using the temperature and the open-circuit voltage of the battery, wherein the processor represents data of a relation between battery SOCs and battery open-circuit voltages on a two-dimensional coordinate system at a plurality of different temperatures at a time point when a battery is charged or discharged, and divides segments according to increase tendencies or decrease tendencies of the data represented on the two-dimensional coordinate system such that gradients of a linear function for respective segments are different from each other, wherein the processor calculates a current SOC of the battery using the temperature of the battery, the open-circuit voltage of the battery, and a gradient and an intercept of the linear function stored in the SOC table, and extracts an SOC based on the open-circuit voltage of the battery when the SOC of the battery was calculated, by referring to the SOC table, issues a command to display the calculated SOC and the fact that a difference between the calculated SOC and the extracted SOC is larger than a predetermined critical value when the difference between the calculated SOC and the extracted SOC is larger than the predetermined critical value, and issues the command to display the calculated SOC when the difference between the calculated SOC and the extracted SOC is smaller than the predetermined critical value, wherein the processor issues a command to store a number of errors in which the fact that the difference between the calculated SOC and the extracted SOC is larger than the predetermined critical value is detected, when the difference between the calculated SOC and the extracted SOC is larger than the predetermined critical value, and to update the data stored in the SOC table when the number of errors is larger than a predetermined reference number.

9. The battery management system of claim 8, wherein:
the charge control switch is configured to switch the current supplied from the current source to the battery in response to the charge control signal; and
the discharge control switch is configured to switch the current outputted from the battery to the load in response to the discharge control signal.

10. The battery management system of claim 9, wherein the processor stores function information representative of the relation between battery open-circuit voltages and battery SOCs for each segment in the SOC table.

11. The battery management system of claim 10, further comprising a user interface device configured to divide the entire region of the two-dimensional coordinate system representing the relation between battery open-circuit voltages and battery SOCs in a plurality of segments at the plurality of different temperatures at a time point when a battery is charged or discharged, calculate the gradient and the intercept of the linear function representative of the relation between battery open-circuit voltages and battery SOCs for each segment, and transmit the calculated gradient and the calculated intercept to the processor.

12. The battery management system of claim 10, wherein the function information indicates the gradient and the intercept of the linear function, and
the gradient a and the intercept b satisfy the following equations:

$$a = \frac{n\sum x_i y_i - \sum x_i \sum y_i}{n\sum x_i^2 - (\sum x_i)^2}$$

and $$b = \frac{\sum y_i \sum x_i^2 - \sum x_i \sum x_i y_i}{n\sum x_i^2 - (\sum x_i)^2}$$

where x and y represent a battery SOC and a battery open-circuit voltage, respectively, i represents a variable for distinguishing a plurality of battery SOCs and battery open-circuit voltages which are selected for each segment so as to be applied to the equations, and a natural number n represents the total number of battery SOCs and battery open-circuit voltages which are selected in the respective segments.

13. The battery management system of claim 8, wherein the processor controls the current supplied to the battery to have a pulse form with a predetermined frequency during some periods of the period in which the battery is charged, in order to calculate parameters of elements applied to the battery equivalent model.

14. The battery management system of claim 8, wherein the processor controls the current supplied to the load from the battery to have a pulse form with a predetermined frequency during some periods of the period in which the battery is discharged, in order to calculate parameters of elements applied to the battery equivalent model.

* * * * *